United States Patent [19]

Hereikson

[11] Patent Number: 4,888,558
[45] Date of Patent: Dec. 19, 1989

[54] PHASE DETECTOR FOR AMPLITUDE MODULATED RADIO FREQUENCY SIGNALS CONTAINING A LOW FREQUENCY WAVEFORM

[75] Inventor: Earl C. Hereikson, Otis Orchards, Wash.

[73] Assignee: Hewlett-Packard Company, Palo Alto, Calif.

[21] Appl. No.: 263,107

[22] Filed: Oct. 26, 1988

[51] Int. Cl.[4] ............................................... H03D 1/00
[52] U.S. Cl. .................................... 329/345; 328/134
[58] Field of Search .......................... 329/50, 135, 146; 328/133, 134; 307/231, 350, 525, 526, 527

[56] References Cited

U.S. PATENT DOCUMENTS 2,919,404 12/1959 Rock, Jr. ..................... 329/146 X Primary Examiner—Eugene R. Laroche
Assistant Examiner—Robert J. Pascal
Attorney, Agent, or Firm—William J. Bethurum

[57] ABSTRACT

A low noise floor phase detector is designed with a transmission line coupler to take advantage of the low noise characteristics of such couplers and their improved operational characteristics relative to a transformer. The preferred detector circuitry also utilizes amplitude detectors that include signal terminating means to operate the diodes at a conduction angle for maximum signal to noise ratio and effective impedance matching between the circuit components.

11 Claims, 8 Drawing Sheets

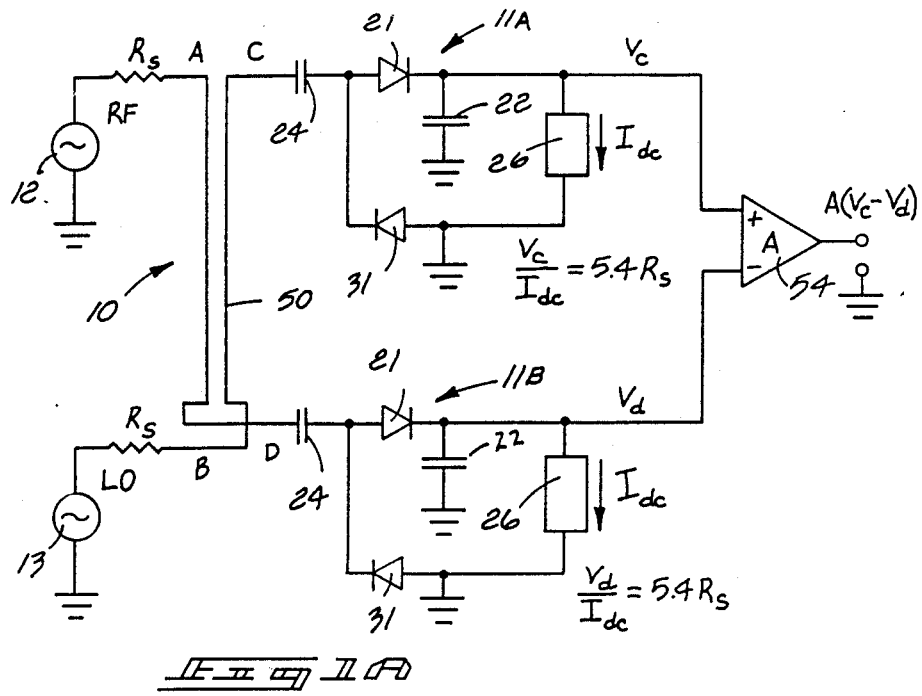
FIG. IIA
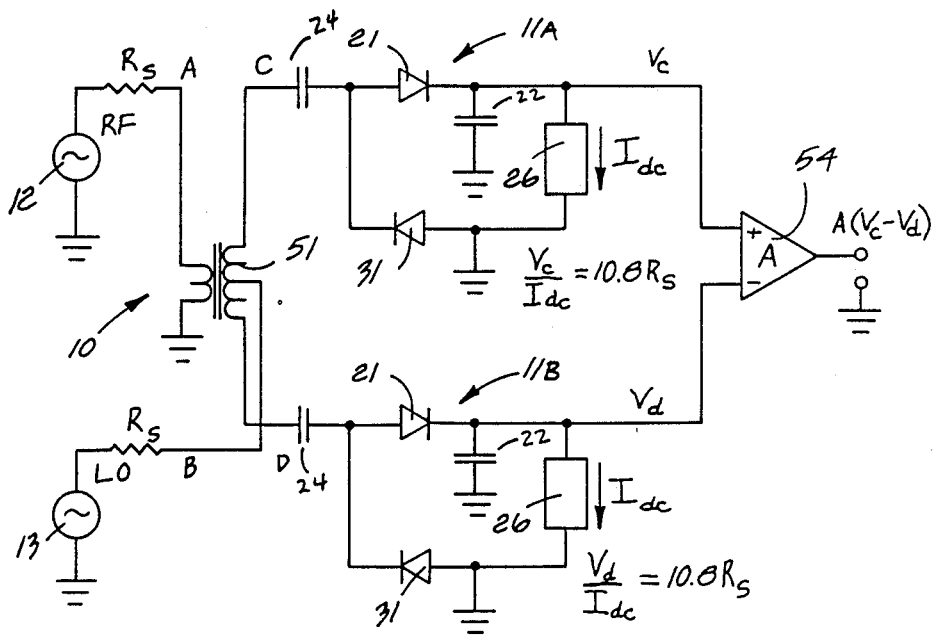
FIG. IIB

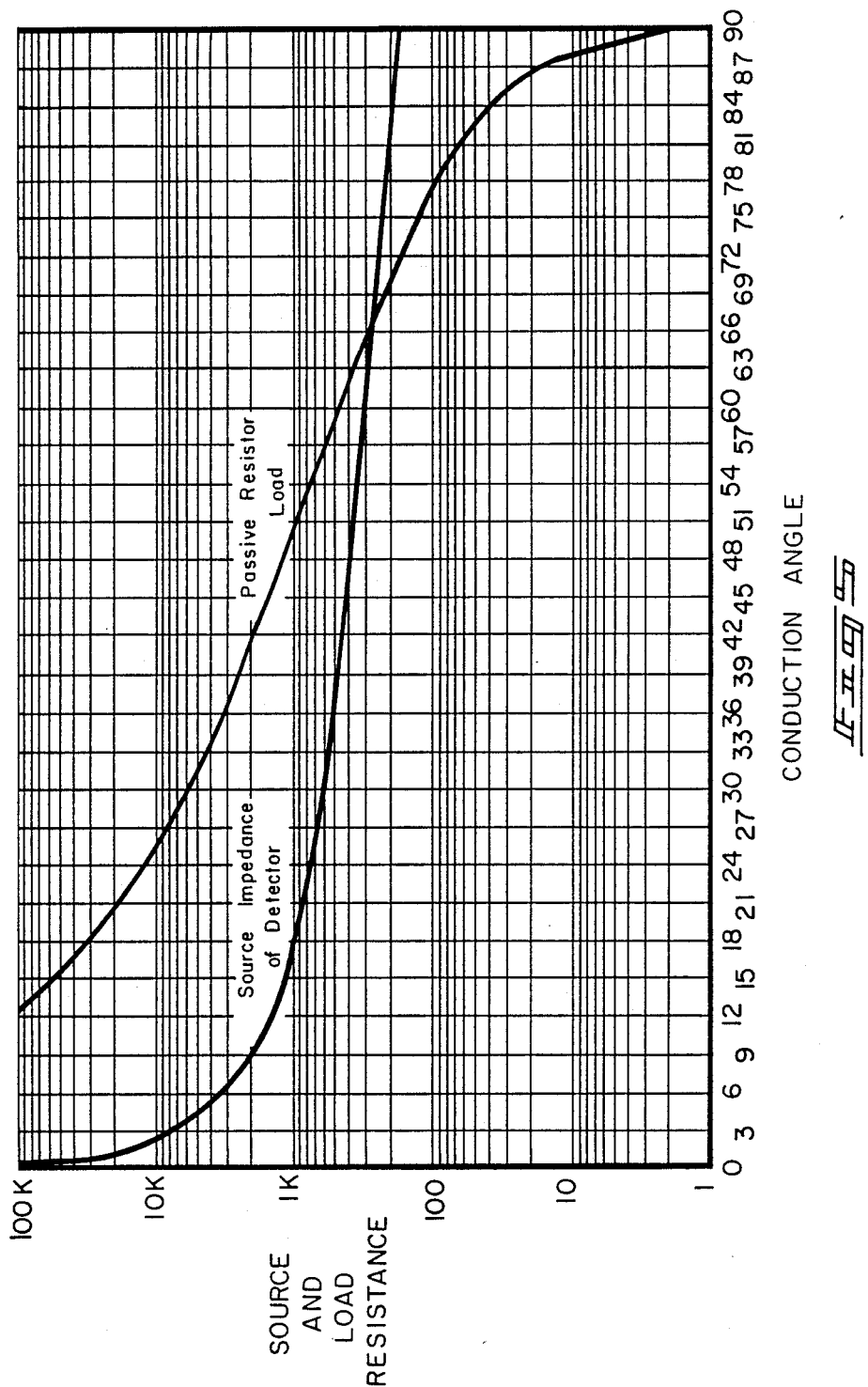

$$R_{in} = \frac{dV_{out}}{dI_{dc}} = e\frac{(R_s + R_d)\pi}{\cos^{-1}\left(\frac{\frac{V_{out}}{2} + V_d}{V_p}\right)}$$

$$\left.\frac{dI_{dc}}{dV_p}\right|_{V_{out}=CONSTANT} = e\frac{\sin\left(\cos^{-1}\left(\frac{\frac{V_{out}}{2} + V_d}{V_p}\right)\right)}{R_{in}\cos^{-1}\left(\frac{\frac{V_{out}}{2} + V_d}{V_p}\right)}$$

$$\left.\frac{dV_{out}}{dV_p}\right|_{I_{dc}=CONSTANT} = e\frac{\sin\left(\cos^{-1}\left(\frac{\frac{V_{out}}{2} + V_d}{V_p}\right)\right)}{\cos^{-1}\left(\frac{\frac{V_{out}}{2} + V_d}{V_p}\right)}$$

LET $\cos^{-1}\left(\frac{\frac{V_{out}}{2} + V_d}{V_p}\right) = \theta$

MAXIMUM SNR WHEN $\dfrac{\frac{dV_{out}}{dV_p}}{\sqrt{R}} = $ MAXIMUM $$\frac{d}{d\theta}\left(\frac{\frac{dV_{out}}{dV_p}}{\sqrt{R}}\right) = \frac{-\frac{1}{2}\sin\theta + \theta^2\cos\theta}{\theta^{3/2}} = 0$$

$\theta = 1.165 \text{ rad } (67°)$ FOR MAXIMUM SNR

FIG. 15

$$C = \frac{1}{\sqrt{2}}\, RF\angle\alpha + \frac{1}{\sqrt{2}}\, LO\angle\alpha-90°$$
$$D = \frac{1}{\sqrt{2}}\, LO\angle\alpha + \frac{1}{\sqrt{2}}\, RF\angle\alpha-90°$$
FIG. 15
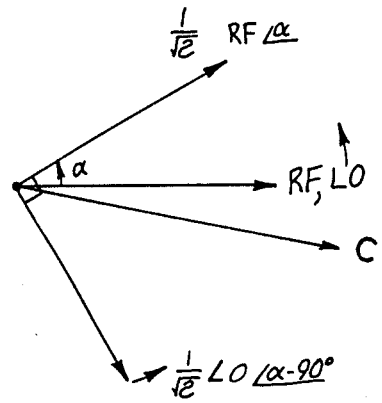
FIG. 16A
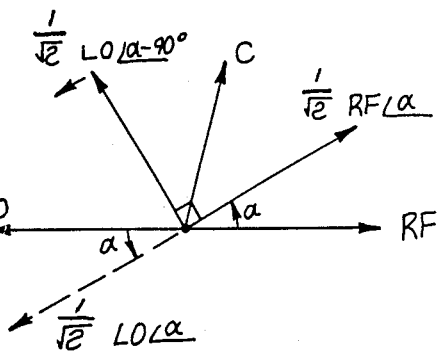
FIG. 17A
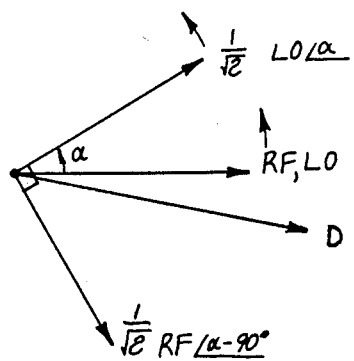
FIG. 16B
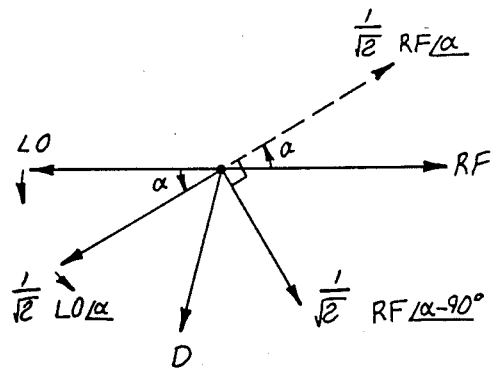
FIG. 17B

PHASE DETECTOR FOR AMPLITUDE MODULATED RADIO FREQUENCY SIGNALS CONTAINING A LOW FREQUENCY WAVEFORM

TECHNICAL FIELD

This disclosure relates to phase detectors for radio frequency circuit measurements.

BACKGROUND ART

The most common radio frequency (RF) phase detector is a double balanced mixer. A double balanced mixer has a radio frequency (RF) port, a local oscillator (LO) port and an intermediate frequency (IF) port. The impedance of these three ports is 50 ohms. The mixer produces both a sum and a difference product. The sum product is removed by filtering so that only the difference product remains. The difference product for an ideal mixer is a cosine of the phase difference of the LO and RF frequencies. The phase slope of the mixer is a function of the IF power output. Because the derivative of a cosine wave is a sine wave, the peak voltage of the sinusoid is equal to the phase slope (volts/radian) when the output is at zero volts. For example, zero dBm at the IF output of the mixer is equal to a 0.316 volt peak sinewave into 50 ohms, and the phase slope is 0.316 volts per radian at zero volts output.

The IF power at the output is a function of the RF and LO power at the input and the conversion loss of the mixer. Conversion loss is the difference between the RF power and the IF power. Usually the LO power is much greater than the RF power, which gives the minimum conversion loss. The typical conversion loss of a mixer will vary between 6 and 9 dB. 3dB of the conversion loss is due to the lost power in the sum product that is filtered. The extra conversion loss is due to losses in the mixer and efficiency of the switching diodes. Increasing the RF power until it is equal to the LO power will increase the IF power and phase slope but at a lower conversion loss.

With equal power at the LO and RF ports, the output approaches a triangle wave instead of a cosine wave. In order to maintain a consistent definition of conversion loss of a phase detector, it can be redefined in terms of phase slope, IF port source resistance, RF power and RF source resistance. Let phase slope equal $K\phi$, IF source resistance equal $R_i$, RF peak voltage equal $V_r$, and RF source resistance equal $R_r$. The conversion loss is:

$$(10)Log(V_r^2/R_r)-(10)Log(K\phi^2/R_i)$$

Because $K\phi$ equals the peak IF voltage for a cosine IF output, this definition is consistent with the case where the RF power is much less than the LO power. The conversion loss for mixers where the RF and the LO power levels are equal is typically 12 to 15 dB. For example, a typical high level mixer with +20 dBm power into the RF and LO ports would have a peak RF voltage of 3.16 volts and a phase slope of 0.56 to 0.8 volts per radian.

By modeling the IF output of the mixer as an ideal voltage source and a 50 ohm source resistance, the noise floor of the phase detector can be determined. The source voltage is double the voltage measured when terminated into a 50 ohm load resistor because of the divide ratio of the source resistance and the load resistance. The single sideband phase noise of the phase detector referred back to the RF and LO source is equal to:

$$(10)Log(0.5(E_n/K\phi)^2),$$

where $E_n$ is the IF source resistance noise. Therefore, a typical mixer with a $K\phi$ of 0.5 volts per radian terminated in 50 ohms would have a source voltage of 1 volt per radian and a source noise of 0.89 nanovolts, giving a single sideband phase noise floor of $-184$ dBc in a 1 Hz bandwidth.

The noise figure of the phase detector is 3 dB less than the conversion loss of the phase detector as defined above. For the above example, a conversion loss of 14 dB and a RF power of 18 dBm would give the 0.5 volts per radian discussed. 18 dBm of RF power has a single sideband phase noise floor of $-177-18=-195$ dBc. The noise figure is $-184-(-195)=11$ dB. This result is 3 dB less than the 14 dB of conversion loss. The reason that the noise figure of the phase detector is 3 dB better than the conversion loss is that the double sideband noise at the RF port is converted to single sideband noise at the IF port. When relating single sideband noise at the IF port back to single sideband noise at the RF port, there is a 3 dB correction factor.

The amplifier that follows the phase detector will also contribute to the noise floor of the phase detector. Its contribution can be accounted for in terms of noise figure. The noise figure of a typical differential pair amplifier is about 3 dB for a 50 ohm source impedance. For the example above the total noise floor of the phase detector and amplifier following the phase detector will be $-181$ dBc in a 1 Hz bandwidth giving a total noise figure of 14 dB.

Another type of phase detector can be described as a sum-difference peak detector. This detector adds the RF to the LO at one output port and subtracts the RF from the LO at the other output port. By peak detecting the signals at the sum port and difference port and subtracting the outputs of the peak detectors, a very high phase slope for relatively low RF and LO powers is achieved. However, the source impedance of a peak detector can be very high. Given the definition of the conversion loss of the phase detector, a very high phase slope could have a very poor conversion loss if the IF source impedance is very high. For example, using a peak detector on the sum and difference ports would give an IF voltage output of equal to twice the RF voltage input. With a source impedance of about 10000 ohms, the conversion loss would be 17 dB. This high a conversion loss makes the phase detector undesirable for low noise applications.

DISCLOSURE OF INVENTION

The low noise floor phase detector for radio frequency signals according to this disclosure basically comprises coupling means for two radio frequency signals interposed between the signal sources, amplitude detector means having two outputs at which demodulated signals are produced having amplitudes proportional to the amplitudes of the low frequency signal components present in the incoming radio frequency signals, and summation means for producing an output signal that is a function of any difference in the amplitudes of the demodulated signals. Any detected difference in these amplitudes will be a function of the phase difference between the two incoming radio frequency signals.

According to a first aspect of this invention, the low noise characteristics of the phase detector circuitry are a product of the utilization of a transmission line coupler as the combining means interosed between the radio frequency signal and the amplitude detectors.

A second aspect of this invention pertains to the utilization of novel amplitude detector circuits within the phase detector. The novel amplitude detectors each include a pair of semiconductor diodes oriented oppositely to one another within parallel circuits that receive one output from the combining means. The diodes are oriented oppositely to one another and each has one side operatively connected to ground through a capacitor. Terminating means is connected across the parallel circuits to bias each diode at a conduction angle of approximately 67 degrees, the individual diodes being caused to conduct in sequence during 37 percent of each radio frequency cycle directed to them, while also matching the radio frequency load impedance of each amplitude detector to the radio frequency impedance of the signal output to which it is connected.

BRIEF DESCRIPTION OF DRAWINGS

FIG. 1A is a simplified circuit diagram showing the general components of the phase detector;

FIG. 1B is a modified version of the circuit in FIG. 1A;

FIG. 5 is a plot of diode conduction angle as a function of the source impedance and load resistance (on a logarithmic scale);

FIG. 6 is a summarized listing of the mathematical relationships by which the diode conduction angle for maximum SNR was calculated;

FIG. 15 is a schematic diagram of the transmission line coupler;

FIGS. 16A and 16B are phase vector diagrams illustrating signal components at outputs A and B, respectively in FIG. 15, when the incoming signals RF and LO are in phase; and FIGS. 17A and 17B are phase vector diagrams illustrating the signal components at outputs C and D in FIG. 15 when the signals RF and LO are out of phase 180 degrees relative to each other.

BEST MODES FOR CARRYING OUT THE INVENTION

Figure 2:
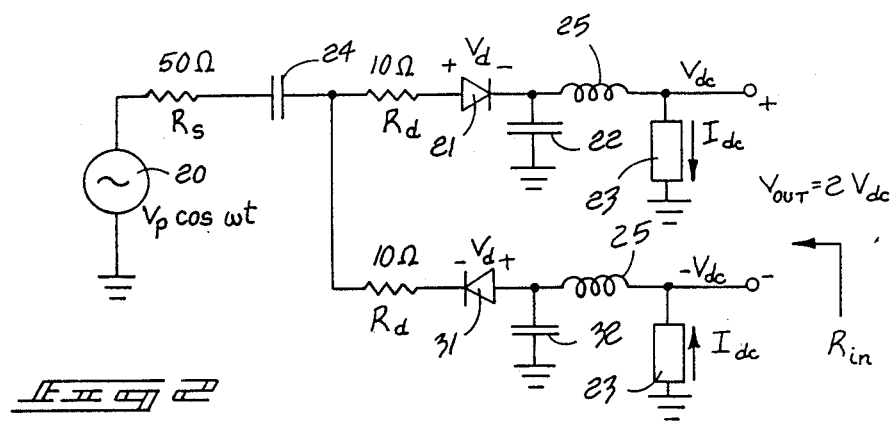
FIG. 2 is a schematic diagram illustrating the general circuit components of an amplitude detector constructed according to this disclosure.

This invention is a low noise phase detector as illustrated generally in FIGS. 1A and 1B. The phase detector consists of a means 10 for combining two radio frequency (RF) signals, and a high signal to noise ratio (SNR) means 11 for detecting the amplitudes of the combined RF signals. The means 10 for combining the two RF signals consists of two RF inputs (ports A and B) and two RF outputs (ports C and D) such that the signals at the outputs are equal linear summations of the inputs. For example, an RF signal applied at A by a radio frequency (RF) source 12 will result in equal signal levels at C and D. Also an RF signal applied at B by a reference local oscillator source 13 will reult in equal signal levels at C and D. Applying a signal at both inputs will result in a linear summation at the outputs. The phase relationshp at the outputs should be such that when the two RF signals from A and B arrive in phase at port C they are 180 degrees out of phase at port D - when the phase is +90 degrees at port C it is -90 degrees at port D, when the phase is 180 degrees at port C it is zero degrees at port D. The amplitude at port C will increase as the relative phase between the signals from port A and port B changes from 180 degrees to zero degrees. The same is true for port D. When the phase difference at C is 90 degrees (plus or minus) and 90 degrees (plus or minus) at port D, the amplitude at port C and D will be the same.

The high SNR amplitude detectors at ports C and D measure the amplitude of the combined RF signals from ports A and B. Subtracting the outputs of the two amplitude detectors gives a phase detector output which varies with the relative phase of the RF signal at port A and the RF signal at port B. The phase slope of this phase detector is a function of the amplitude detector constant and the loss of the device that combines the RF signals. The source impedance is twice the source impedance of one of the amplitude detectors, since they are used in series.

One example for a combining means 10 would be a 3 dB transmission line coupler (FIG. 1A). The phase relationship between the signal output at the coupled port and the thru port is always 90 degrees for any transmission line coupler. This meets the necessary conditions as stated above. The RF source impedance at the outputs C and D is 50 ohms for a 50 ohm coupler. The detector source impedance for each of the low noise AM detectors can be designed to be approximately 300 ohms. The total source impedance is therefore 600 ohms. For a lossless coupler, the phaseslope for this detector is 2.20 times the peak RF source voltage when the LO power level is much larger than the RF power level. This gives a conversion loss of 4 dB. When the RF and LO signal inputs of the phase detector have equal power levels, the conversion loss is only 3 dB higher, bringing the conversion loss to 7 dB. The typical loss of a transmission line coupler is less than 1 dB, giving a worst case conversion loss of 8 dB. For this example, the conversion loss is about 4 to 7 dB better than the example of the mixer as a phase detector discussed in the background information of this disclosure. In a 600 ohm system, the same low noise amplifier would have a 0.4 db noise figure compared to a 3 db noise figure in a 50 ohm system. This gives a total improvement of 6 to 9 dB over the mixer method.

FIGS. 1A and 1B illustrate the general circuitry of the phase detector. The combining means 10 for the two incoming RF signals in FIG. 1A is a transmission line coupler 50. This might be a pair of parallel traces on a circuitboard or a pair of conductive wires. In a preferred form of this invention, the transmission line coupler is a 3 dB coupler of known construction, comprising a length of coaxial cable having a pair of twisted interior conductors insulated from one another and located within a surrounding shield. In FIG. 1B, the combining means is shown as a conventional 2:1 transformer 51.

In both FIG. 1A and 1B, the combining means 10 has two signal inputs designated by the letters A and B, and two signal outputs, designated by letters C and D. The signal outputs C and D serve as both through ports and coupled ports for the incoming radio frequency signals from signal inputs A and B. More specifically, in FIG. 1A the signal output C is a through port for the RF signal from signal input B and a coupled port for the RF signal at signal input A. Signal output D is operatively connected to the signal inputs A and B in an opposite manner. In FIG. 1B, signal outputs C and D are through ports for the RF signal at signal input B and coupled ports for the RF signal at signal input A.

The amplitudes of the radio RF at each signal output C and D are summations of the two incoming RF signals at signal inputs A and B. To provide phase detection, the phase angle of at least one of the incoming signals at signal inputs A or B must be shifted by a constant angular amount between the two signal outputs C and D. In the case of a transmission line coupler 50 (FIG. 1A), the phase of each signal input is shifted 90 degrees between the two signal outputs C and D. In the case of the transformer 51 shown in FIG. 1B, the phase of the incoming signal from signal input A is shifted 180 degrees between signal outputs C and D, and no phase shift occurs with respect to the incoming signal from signal input B. These phase relationships will be described further with respect to the phase diagrams shown in FIGS. 16A, 16B, 17A and 17B.

The signal outputs C and D are connected to separate upper and lower amplitude detectors 11A and 11B, respectively, each including a pair of diodes 21, 31 and signal terminating means 26, illustrated in FIGS. 1A and 1B as a constant current source 26. In FIG. 1A, for example, in amplitude detector 11A one side of diode 21 is connected to ground through a capacitor 22, and the corresponding side of diode 31 is connected to ground through capacitor 24 and the LO signal source 13. In the lower amplitude detector 11B, the same circuitry is used, with the one side of its diode 31 being connected to ground through an identical capacitor 24 and the RF signal source 12. It is to be understood that the signal sources 12 and 13 can be separate sources, but will typically be a single source of RF signals having the signal divided through a delay line or a circuit loop that will effect a constant phase relationship between the two signals directed to the phase detector.

The demodulated output signals from the amplitude detectors are directed to summation means shown in FIGS. 1A and 1B as amplifier 54. The output of amplifier 54 is a function of the differences between the demodulated output voltages of the two amplitude detectors.

FIG. 2 generally illustrates the components and circuit equivalents included within the amplitude detector. A pair of semi-conductor diodes 21, 31 are oriented oppositely to one another within parallel circuits adapted to be operatively connected to a radio frequency (RF) signal source 20. A first capacitor 22 is operatively connected between one side of the first diode 21 and ground. A second capacitor 32 is operatively connected between one side of the second diode 31 and ground.

Figure 3:
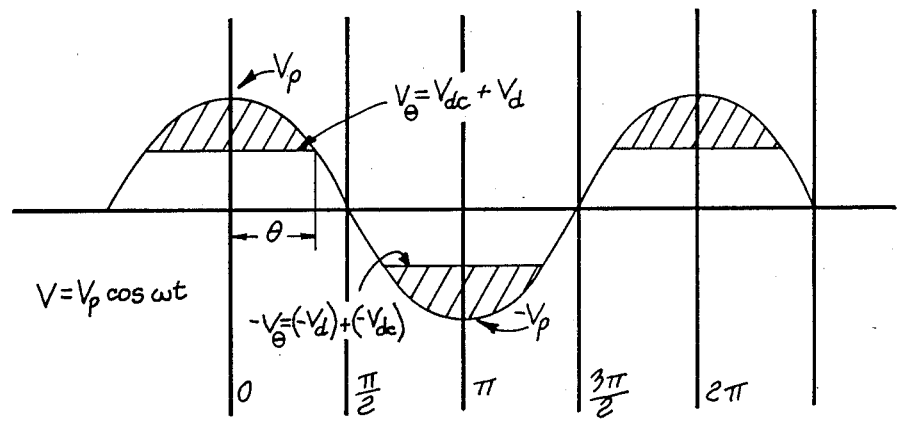
FIG. 3 is a graph of output voltage as a function of radians.

The amplitude detector is completed by terminating means 23 connected across the parallel circuits for properly biasing each diode to cause it to conduct current from the signal source 20 at a conduction angle $\theta$, which is graphically illustrated in FIG. 3. The conduction angle is selected to minimize the Signal to Noise Ratio (SNR) of the amplitude detector. It also matches the radio frequency load impedance of the amplitude detector to the radio frequency impedance of the signal source 20. The signal terminating means 23 has an output at which a demodulated signal is produced having an amplitude proportional to the amplitude of any low frequency signal present in a radio frequency signal directed to the amplitude detector from the signal source 20.

Referring further to FIG. 2, the waveform of a typical RF signal having a sinusoidal shape, can be expressed by the formula $V_p \cos\omega t$, where $V_p$ is the peak voltage amplitude of the incoming RF signal. $R_s$ denotes the RF impedance of signal source 20, which is conventionally 50 ohms. Capacitor 24, shown to be in series between signal source 20 and the two parallel diode circuits, provides a "floating" input signal relative to ground. The inclusion of capacitor 24 in conjunction with capacitors 22 and 32 is a circuit design alternative that is described below. $R_d$ is a circuit equivalent for the typical dynamic on resistance of each diode 21, 31. For illustration, $R_d$ is quantified as 10 ohms. The inductor 25 provides RF filtering of the low frequency signal prior to the signal terminating means 23. Signal terminating means 23 is illustrated as two separate devices leading from each parallel circuit to ground. The current flowing through each device is designated as $I_{dc}$. The voltage level at the connection between the signal terminating means 23 and each parallel circuit is designated as $V_{dc}$. The output voltage across the terminal end of the parallel circuits is designated as $V_{out}$ and is equal to $2V_{dc}$.

FIG. 3 graphically illustrates the angular relationships between voltage and current (indicated by the shaded lines within the sinusoidal curve) for a selected diode conduction angle $\theta$. The calculation of $\theta$ and the radio frequency load impedance of the amplitude detector ($R_{in}$) is presented in FIG. 6. It can be seen that when these mathematical relationships are solved to determine the maximum Signal to Noise Ratio, $\theta$ equals 1.165 radians or approximately 67°. This means that each diode 21, 22 conducts over a total angle of 134° during each half cycle of the incoming radio frequency waves or during 37% of each full cycle. Once the optimum conduction angle for lowest noise operation is determined, one can calculate the low frequency source impedance of the amplitude detector required to achieve optimal operation. Based on a conduction angle of 1.1656 radians, the amplitude detector source impedance is 2.695 times the impedance of the RF source impedance, which in turn is the sum of the impedance of source 20 plus the impedance of each diode 21, 31 ($R_s$ plus $R_d$).

It was further demonstrated experimentally that the average RF load impedance that the amplitude detector presents to the RF source 20 is approximately equal to the source impedance of the RF source. This properly matches the radio frequency load impedance of the detector to the radio frequency impedance of the signal source for efficient termination of the RF signal.

Figure 4:
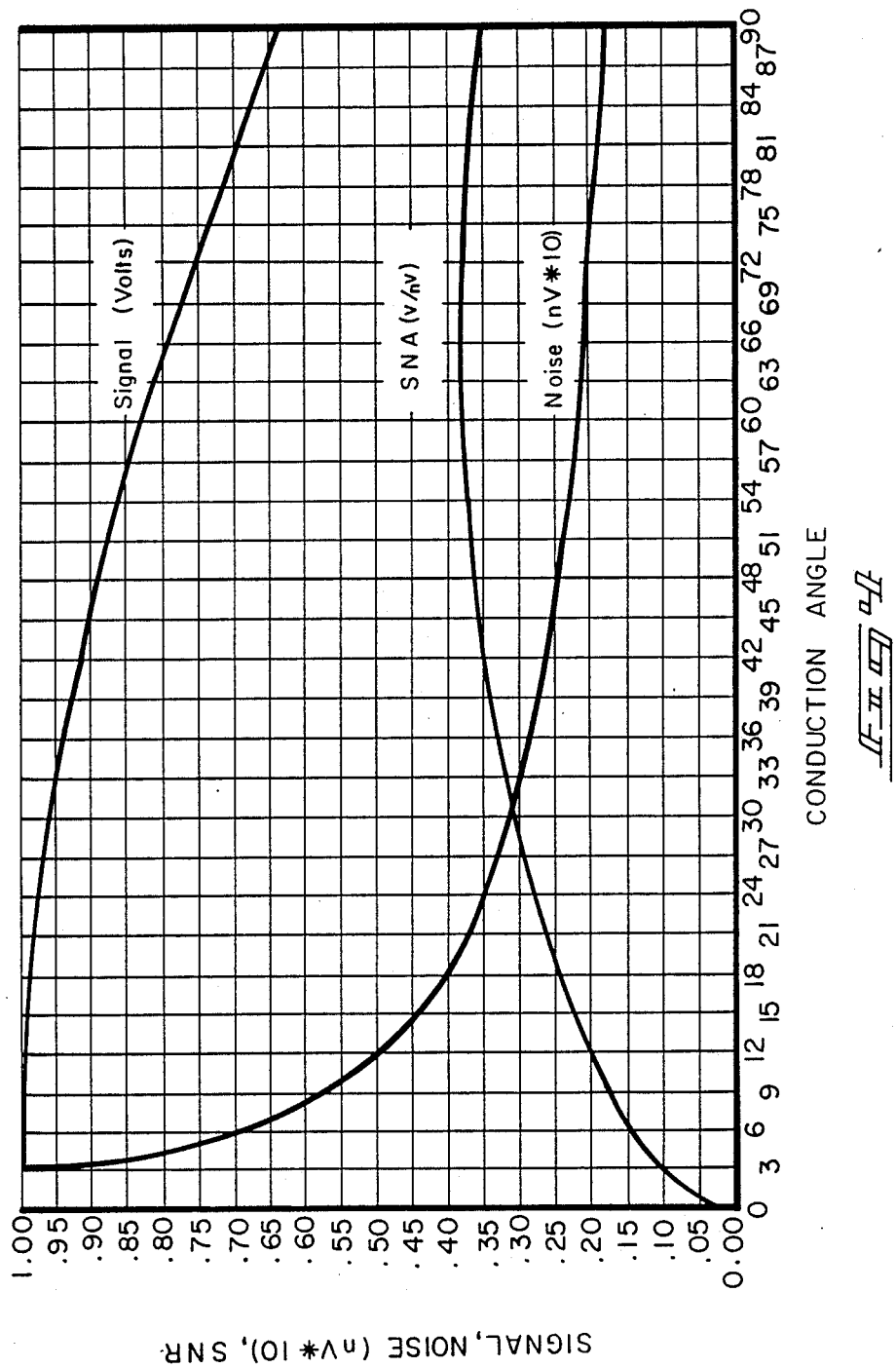
FIG. 4 is a plot of SNR, noise and signal amplitude as a function of diode conduction angle.

FIGS. 4 and 5 are plots of theoretically derived data relating to the Signal to Noise Ratio as a function of diode conduction angle (FIG. 4) and the conduction angle as a function of the dynamic source impedance of the detector, as well as a passive resistor load utilized as the signal terminating means 23. They graphically illustrate the optimum Signal to Noise Ratio and load matching that occur at a conduction angle of 67°.

Figure 8:
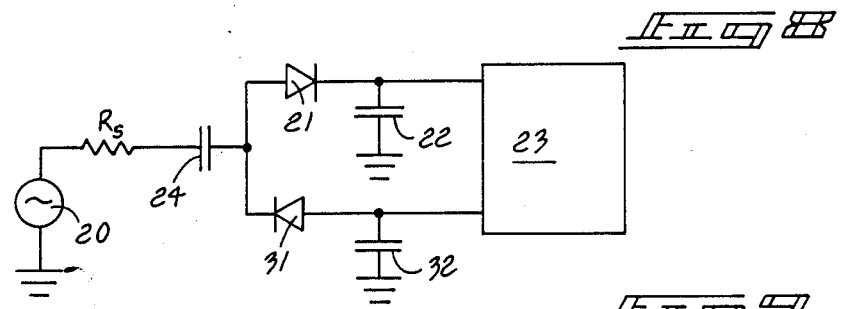
FIGS. 8-10 generally illustrate three variations of the amplitude detector circuitry.
Figure 9:
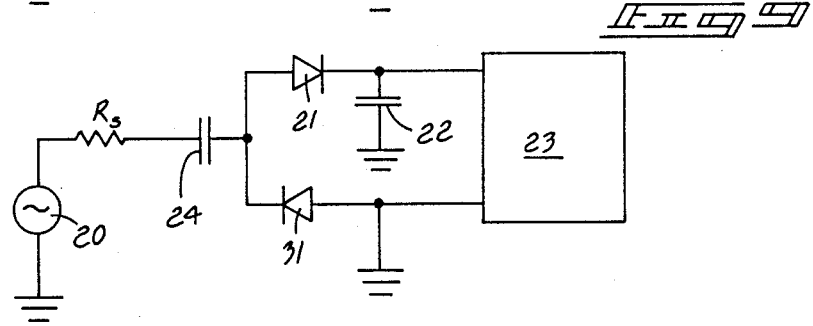
Figure 10:
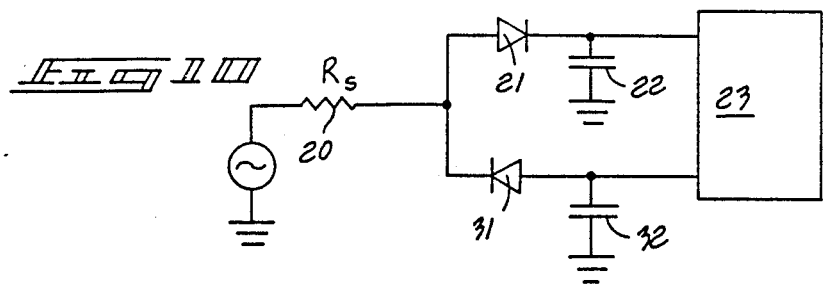

FIGS. 8-10 schematically illustrate variations in circuit design that incorporate the operational features described above. In FIG. 8, three capacitors are used, the third capacitor 24 providing a "floating" RF signal input to the parallel circuits that include diodes 21, 31. In FIG. 9, only two capacitors are used. One diode 31 has one side shorted directly to ground and its remaining side is connected to ground through the floating connection provided by capacitor 24 and the signal source 20. It is to be understood that either diode 21 or 31 can have one side directly shorted to ground in this manner. FIG. 10 shows the use of both capacitors 22, 32 as previously described, with one side of diode 31 shunted to ground directly through the RF signal source 20.

Figure 11:
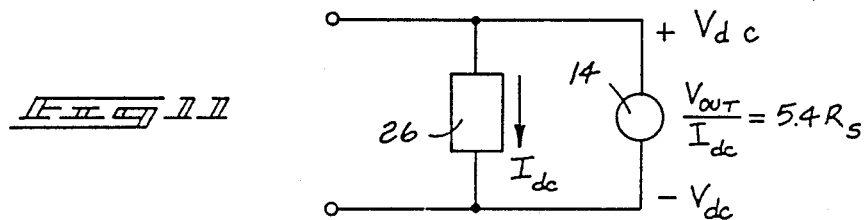
FIGS. 11-14 schematically illustrate four types of terminations usable in the amplitude detector.
Figure 12:
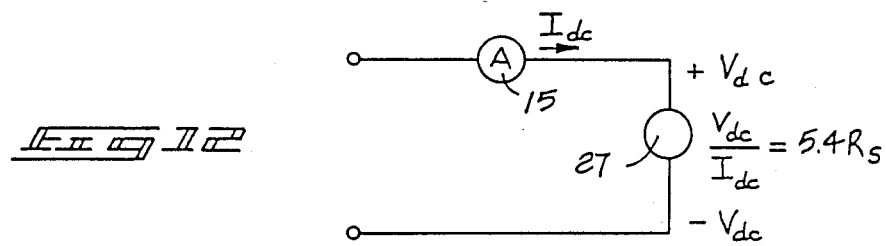

FIGS. 11 through 14 schematically illustrate the various types of devices that can be used as the terminating means 23 in the amplitude detector. FIGS. 11 and 12 numerically indicate the low frequency impedance value of the terminating means 23 required to achieve the selected diode conduction angle of 67°. It is stated as a function of the signal source impedance $R_S$.

In FIG. 11, the terminating means is shown as a constant current source 26, the output, ($V_{out}$), being the voltage across the current source 26. The output voltage may be measured by a conventional voltage meter 14 connected across the current source 26.

In FIG. 12, the signal terminating means is a constant voltage source 27 and the output of the amplitude detector ($I_{out}$) is readable as the current flowing through voltage source 27. The output current signal may be measured by a conventional current meter 15 in series with the voltage source 27.

Figure 13:
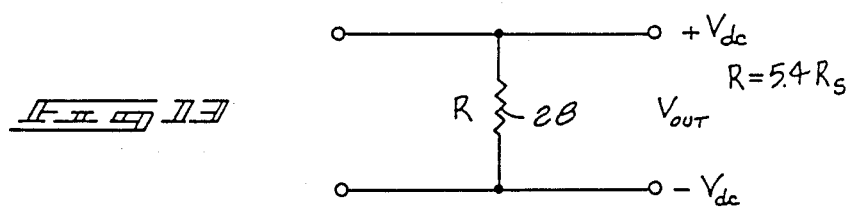
Figure 14:
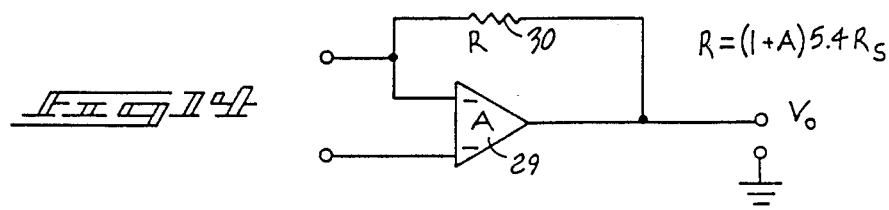

In FIG. 13, the signal terminating means is a passive resistive load or resistor 28 and the output ($V_{out}$) is readable as the voltage across resistor 28. In FIG. 14 the signal terminating means is a active resistive load comprising amplifier 29 and feedback resistor 30 where the value of resistor 30 is given by the equation shown and provides an equivalent impedance equal to that shown in FIG. 13. The output is readable as changes in the voltage output ($V_{out}$) at the output terminals of amplifier 29.

Figure 7:
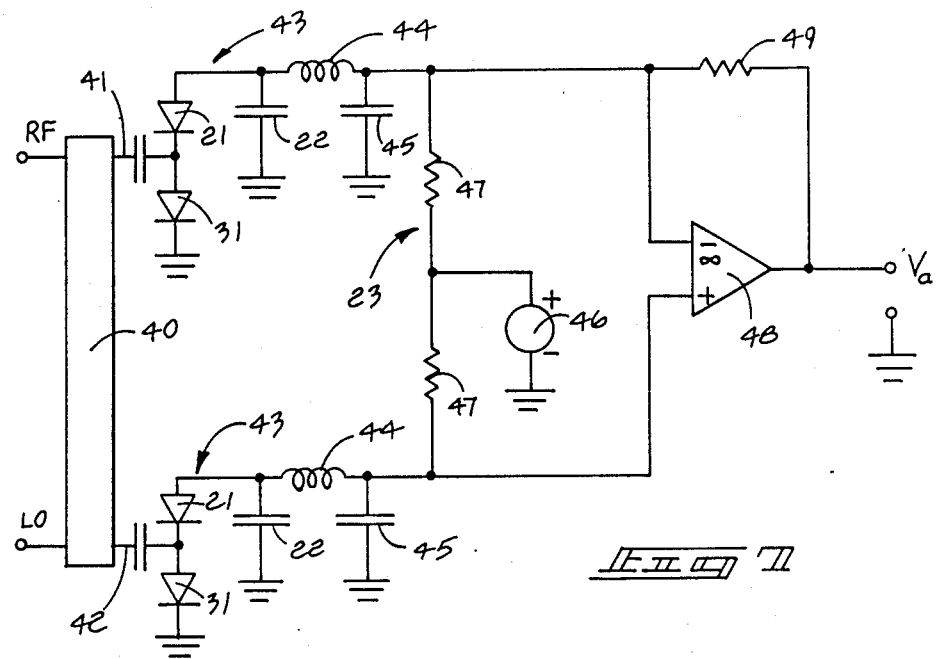
FIG. 7 is a simplified wiring diagram of the present best mode for carrying out this invention.

The best mode of utilizing the amplitude detector at the present time applies to its inclusion within a phase detector designed for measuring radio frequency noise. A simplified circuit diagram of the current phase detector circuitry is shown in FIG. 7. In accord with conventional notation, two incoming radio frequency signals are fed to the radio frequency (RF) and local oscillator (LO) signal inputs of a combining means 40 having separate signal outputs 41 and 42. Signal outputs 41 and 42 serve as both through ports and coupled ports for the incoming radio frequency signals at the signal inputs. The phase angle of at least one of the incoming signals is shifted by a constant angular amount between the two signal outputs 41 and 42. While the combining means 40 might be a transformer, it is preferably a transmission line coupler, such as a length of coaxial cable having a pair of twisted interior conductors insulated from one another and surrounded by a cylindrical shield.

Each signal output 41, 42 is fed to an amplitude detector 43 of the type described above. In the illustrated circuit, the two diodes 21, 31, which are included within parallel circuits from the signal outputs 41, 42, are connected with one side of diode 21 shunted to ground through capacitor 22 and one side of diode 31 shunted to ground. Filtering of RF wave forms is assured through provision of a filter comprised of an inductor 44 and capacitor 45.

The signal terminating means 23 is shown in FIG. 7 as passive resistors 47. A constant voltage source 46 in series with each resistor 47 provides the turn on voltage for the diodes of the amplitude detectors. The output signals from the two amplitude detectors are directed to a summation means that produces a signal that is a function of any difference in the amplitudes of the demodulated signals produced by the amplitude detectors 43. The illustrated summation means is an operational amplifier 48 and a resistor 49 that provides negative feedback. Any differences in the output voltage amplitudes at the amplitude detectors 43 will be reflected as a change in voltage ($V_a$) at the output of operational amplifier 48.

FIG. 15 relates the RF signal at the signal outputs C and D of a transmission line coupler 50 to the respective phase characteristics of the incoming LO and RF signals. These phase relationships at signal outputs C and D are illustrated by vector diagrams 16A and 16B. It is assumed for purposes of FIGS. 16A and 16B, that the signals at signal outputs C and D have equal amplitudes and that the phase angles of the LO and RF incoming signals are identical. It can be seen that as the phase of the LO signal increases relative to that of the RF signal, the amplitude of the signal at C will increase and the amplitude of the signal at D will decrease until the phase angle between the signals at A and B is 90 degrees relative to each other. Similarly, FIGS. 17A and 17B assume that the phase angles between the LO and RF signals at A and B are 180 degrees apart, their amplitudes again being equal. As the phase angle of the LO signal increases relative to the RF signal at A, the amplitude of the resulting signal at C will decrease and the amplitude of the signal at D will increase until the phase angle between the incoming signals is again 90 degrees relative to one another. Thus, the instrumentation shown in FIG. 7 can be operated as the incoming RF and LO signals are shifted slightly relative to one another at either of these known points, and the resulting changes in the detector output ($V_a$) will be a function of the phase difference between the incoming RF signals.

As shown in the example, the noise improvement of this invention is about 6 to 9 dB when compared to the mixer used as a phase detector. This invention has the effect of transforming the 50 ohm source impedance up to a 600 ohm source impedance with a corresponding increase in phase slope. This makes the design of the phase detector amplifier much easier because less gain is required and a low noise figure is easy to achieve.

Because the amplitude detectors do not saturate, as in a mixer, the phase slope will increase linearly with increasing power, limited only by the power dissipation of the diodes. In a mixer, higher phase slope is achieved by placing diodes in series for higher LO drive levels, causing higher conversion loss.

One final advantage of this design is the ability to use the phase detector at very low RF power levels into both ports. By biasing the amplitude detector diodes at their turn on voltage, they are able to amplitude detect low power levels.

The invention has been described in language more or less specific as to features of the illustrated circuits. It is to be understood, however, that the invention is not limited to the specific features shown, since the means and construction herein disclosed comprise a preferred form of putting the invention into effect. The invention is, therefore, claimed in any of its forms or modifications within the proper interpretations of the appended claims.

I claim:

1. A low noise floor phase detector for radio frequency signals, comprising:

a transmission line coupler having two signal inputs for respectively receiving incoming signals from two radio frequency sources, and further having two signal outputs which serve as both through ports and coupled ports for the incoming signals;

amplitude detector means connected to the signal outputs of the transmission line coupler for producing two demodulated signals having amplitudes proportional to the amplitudes of any low frequency signals present in the radio frequency signals at the signal outputs of the transmission line coupler; and summation means operatively connected to the amplitude detectors for producing a signal that is a function of any difference in the amplitudes of the demodulated signals.

2. The low noise floor phase detector of claim 1 wherein the transmission line coupler comprises a pair of closely spaced traces on a circuitboard, the lengths of the traces at least partially overlapping one another to effect inductive coupling between them.

3. The phase detector of claim 1 wherein the transmission line coupler comprises a length of coaxial cable including a pair of twisted conductors electrically insulated from one another within a surrounding shield.

4. A low noise floor phase detector for radio frequency signals, comprising:

radio frequency signal combining means having two signal inputs for respectively receiving incoming signals from two radio frequency sources and having two signal outputs, the amplitudes of the radio frequency signals at each signal output being summations of the two incoming signals and the phase angle of at least one of the incoming signals being shifted by a constant angular amount between the two signal outputs;

a pair of amplitude detectors respectively connected to the signal outputs of the combining means, each amplitude detector comprising:

(1) a pair of semiconductor diodes oriented oppositely to one another within parallel circuits operatively connected to one signal output of the combining means;

(2) a first capacitor operatively connected between one side of one diode and ground;

(3) a second capacitor operatively connected between one side of the remaining diode and ground; and (4) terminating means connected across the parallel circuits for biasing each diode at a predetermined conduction angle causing the individual diodes to conduct in sequence during a predetermined percent of each radio frequency signal cycle while matching the radio frequency load impedance of the amplitude detector to the radio frequency impedance of the one signal output, the signal terminating means having an output at which a demodulated signal is produced having an amplitude proportional to the amplitude of any low frequency signal present in a radio frequency signal at the one signal output of the combining means; and summation means operatively connected to the outputs of the terminating means for producing a signal that is a function of any difference in the amplitudes of the demodulated signals produced by the pair of amplitude detectors.

5. The low noise floor phase detector of claim 4 wherein said predetermined conduction angle is substantially equal to 67 degrees and said predetermined percent is substantially equal to 37 percent of each radio frequency signal cycle.

6. The low noise floor phase detector of claim 4 wherein the terminating means is a passive resistive load, the demodulated signal of each amplitude detector being the voltage across the passive resistive load.

7. The low noise floor phase detector of claim 4 wherein the terminating means is an active resistive load, the demodulated signal of each amplitude detector being the voltage across the active resistive load.

8. The low noise floor phase detector of claim 4 wherein the terminating means is a current source, the demodulated signal of each amplitude detector being the voltage drop across the current source.

9. The low noise floor phase detector of claim 4 wherein the terminating means is a voltage source, the demodulated signal of each amplitude detector being the current flowing through the voltage source.

10. The low noise floor phase detector of claim 4 wherein the terminating means is a fixed passive resistance operatively connected to each amplitude detector in series with a source of constant voltage that provides turn on voltage for the diodes.

11. The low noise floor phase detector of claim 4 wherein the summation means comprises a negative feedback operational amplifier having a pair of inputs operatively connected to the respective outputs of the terminating means in the pair of amplitude detectors.

* * * * *

UNITED STATES PATENT AND TRADEMARK OFFICE
CERTIFICATE OF CORRECTION

PATENT NO. : 4,888,558
DATED : December 19, 1989
INVENTOR(S) : Earl C. Herleikson It is certified that error appears in the above-indentified patent and that said Letters Patent is hereby corrected as shown below:

ON THE TITLE PAGE

Item [19] and [75], the inventors name "Hereikson" should be
--Herleikson--.

Signed and Sealed this

Twenty-ninth Day of June, 1993

Attest:

MICHAEL K. KIRK

*Attesting Officer*    *Acting Commissioner of Patents and Trademarks*